March 26, 1968 J. S. WAGENER ET AL 3,375,419

FIELD EFFECT TRANSISTOR WITH POLY-P-XYLYLENE INSULATED GATE STRUCTURE AND METHOD

Filed Feb. 25, 1965

INVENTORS.
JOHANN S. WAGENER
ROBERT L. SHEPARD
RUSSELL D. WESTBROOK

BY Leo A. Plum, Jr.
ATTORNEY

United States Patent Office 3,375,419

Patented Mar. 26, 1968

3,375,419

FIELD EFFECT TRANSISTOR WITH POLY-p-XYLYLENE INSULATED GATE STRUCTURE AND METHOD

Johann S. Wagener, Lakewood, Robert L. Shepard, Cleveland Heights, and Russell D. Westbrook, Fairview Park, Ohio, assignors to Union Carbide Corporation, a corporation of New York Filed Feb. 25, 1965, Ser. No. 435,124
15 Claims. (Cl. 317—235)

This invention relates to field effect transistors of the insulated-gate type.

Insulated-gate field effect transistors are generally planar devices formed in a body of crystalline semiconductor material and have spaced-apart source and drain zones with ohmic contacts thereto. The region between the source and drain zones through which the carriers flow is called the channel. Overlying the channel is a thin metal contact called the gate which is separated from the channel by a thin layer or film of insulating material. The gate also has an ohmic contact and a potential can be applied thereto to generate an electric field in the channel and thereby induce and/or control a flow of carriers between the source and the drain. The field effect transistor of the insulated gate type is thus an active device which can be used for amplification, switching, etc., in a manner similar to other active semiconductor devices. Other characteristics of the insulated-gate field effect transistor can be found in a paper, "The Insulated-Gate Field Effect Transistor," by S. R. Hofstein and F. P. Heiman, Proc. IEEE 51, 1190 (1963).

One of the most critical elements of the field effect transistor is the layer of insulating material separating the gate contact from the channel. A common method for forming this layer on silicon semiconductor bodies is by thermally growing an insulating silicon dioxide ($SiO_2$) film over the channel region. A film of evaporated metal is then deposited over the dielectric $SiO_2$ film to form the gate control structure. Other dielectrics such as silicon monoxide (SiO) can be used as well.

The insulating film of silicon oxide must be of controlled thickness for the electrical capabilities of the device require a thin dielectric film. The film must also be nonporous to prevent contact between the gate electrode and the semiconductor body. Often during preparation of the $SiO_2$ or SiO films of the necessary thinness, pinholes are formed, thereby resulting in a defective device.

Many other problems have arisen in regard to the use of silicon oxide insulating films, such as the diffusion of impurities during the oxide growth into the semiconductor body, thereby unintentionally changing the conductance of the channel region.

It is the primary object of this invention to provide an improved insulated-gate field effect transistor and method for making same.

It is also an object of this invention to provide an improved insulation system for field effect transistors.

Other aims and advantages of this invention will be apparent from the following description, the drawing and the appended claims.

In accordance with the above objects a semiconductor device is provided comprising a semiconductor body having a plane upper surface, said semiconductor body being of one conductivity type, a first zone of opposite conductivity type diffused into a portion of the upper surface of said body, a second zone of conductivity type opposite to that of the semiconductor body also diffused into another part of the upper surface of said body, said second zone spaced apart from the first zone, a dielectric film of a para-xylylene polymer, and in particular, a film of poly(p-xylylene), covering at least a surface portion of the semiconductor body between the first and second zones, and an electrode positioned over the surface of the body covering at least a part of the region between the first and second zones and electrically insulated therefrom by the film of para-xylylene polymer, or, more preferably, poly(p-xylylene).

The poly(p-xylylene) insulation can be applied by vapor deposition in thin pinhole-free films and has high insulating and dielectric characteristics. This material is superior to the other insulating materials previously used in field effect transistors. The films of poly(p-xylylene), for example, are prepared by pyrolyzing a solid p-xylylene dimer to form vapors containing p-xylylene diradicals. Preferably, the solid dimer is heated first to form a dimer vapor and the dimer vapor is then heated further to form vapors containing p-xylylene diradicals. These p-xylylene diradicals are stable in the vapor state, but will condense to form a thin void-free film of solid poly(p-xylylene) upon contact with a cooled transistor substrate. Masking and etching techniques can be used to deposit the poly(p-xylylene) only on the areas of the transistor device requiring the insulating film.

Figure 1:
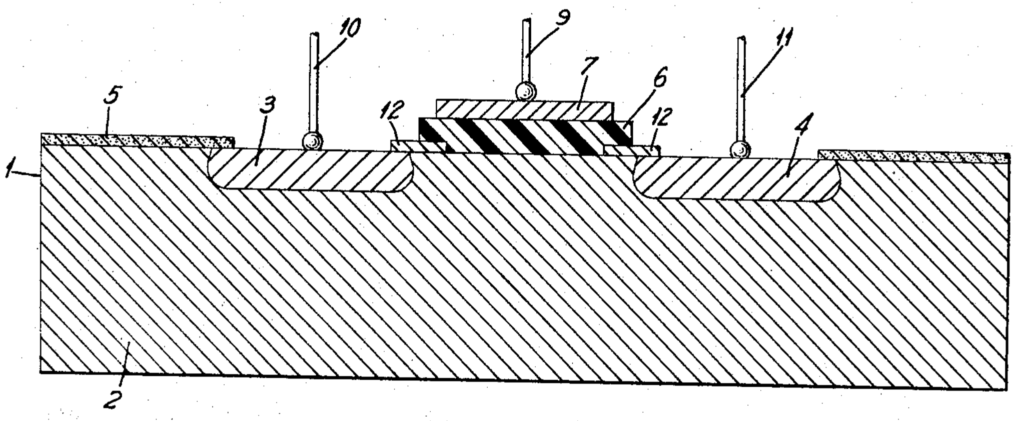
FIGURE 1 shows in cross-section an embodiment of a field effect semiconductor device having the improvements afforded by this invention.

The device will be described in more detail with regard to the drawings where 1 is a semiconductor device formed in a body 2 of semiconductor material, such as silicon. The semiconductor material may be other than silicon, e.g., germanium, gallium arsenide, etc., for it is one of the advantages of this invention that the poly(p-xylylene) insulating film can be produced on any semiconductor material. The invention will be described herein in regard to a silicon semiconductor material, but it is to be understood that the invention is not limited thereto.

The silicon semiconductor body in which the transistors are formed can be one of the familiar single crystal silicon wafers that are sliced from large crystals. The silicon body can also be a layer of monocrystalline silicon formed by vapor deposition or epitaxial growth of silicon on a substrate which can be itself silicon or another suitable material such as sapphire, for example. For the purposes of this invention the term semiconductor body means the crystalline semiconductor wafer, or section thereof, or the actual layer or mass of monocrystalline semiconductor grown or deposited on any substrate, or any surface portion of that layer (the term semiconductor body also covers a body of polycrystalline silicon where such material is usuable in a semiconductor device). The term semiconductor device, as used herein, shall mean the combination of a semiconductor body having the source and drain zones, insulating layer of poly(p-xylylene) and control gate, with or without electrodes for connection to a circuit. It is to be noted that a multiplicity of semiconductor devices can be fabricated from a single wafer or mass of semiconductor material and in regard to that procedure, the term semiconductor body means that portion of the whole wafer of mass which is intended to become a single semiconductor device, to be separated from the remainder of the wafer, as a chip, for example. Or, in the case where a number of active and/or inactive electronic devices are formed in or on the surface of a wafer or mass of semiconductor material, with electrical connections therebetween to form a circuit or part of a circuit, the term semiconductor body here means that portion of the wafer or mass of semiconductor material which is to perform a function as a field effect semiconductor device. In the case where an array of interconnected field effect transistors are formed in a single semiconductor body, for example, wherein the drain of one unit is the source of an adjacent unit, then the term semiconductor body here covers the individual unit comprising two spaced-apart heavily doped zones with a channel therebetween, said channel having an overlying insulated gate control. For convenience the two spaced-apart zones are referred to as a source and a drain, although they each may perform a dual function in this type device. These and other types of insulated-gate field effect transistors which are benefited by this invention are discussed in an article entitled "Metal-Oxide-Semiconductor Field-Effect Transistors" by F. P. Heiman and S. R. Hofstein in the Nov. 30, 1964 issue of "Electronics" at p. 50.

In addition this invention is also meant to cover the case where the source and drain zones extend all the way through a wafer or slice of semiconductive material, rather than merely being shallow zones extending into the surface only of a body. In such cases, the channel would be the region between these two zones, e.g., in a p-n-p arrangement where *n* is the channel. The channel may have surfaces which are continuations of the surfaces of the source and drain zones, i.e., the whole device has two parallel surfaces. Or, the channel cross-section between the source and drain zones may be necked down to a lesser thickness. Gate electrodes with electrical contacts may be located on each side of the channel with an insulating film of this invention disposed between each gate electrode and the underlying channel surface.

In the field effect transistor, the semiconductor body 2 is of one conductivity type and the source zone 3 and drain zone 4 are both of the opposite conductivity type. Thus if the semiconductor body is of n-type semiconductor material, then the source and drain zones are both of p-type material; and if the semiconductor body is of p-type semiconductor material, then the source and drain zones are both of n-type semiconductor material.

A coating 5 of silicon oxide is generally formed over the upper surface of the body by exposure of that surface to an oxidizing atmosphere or agent in a known manner. This oxide layer is utilized as a mask for the formation of the source and drain zones by first forming openings in the oxide layer corresponding to the intended position on the silicon body of the source 3 and drain 4 islands. The removal of the silicon oxide from the areas 3 and 4 may be effected by photoresist techniques in combination with hydrofluoric acid, etching, or by other known processes. An impurity of the acceptor or donor type is then placed on the semiconductor body in the areas 3 and 4 and heat is applied to cause diffusion of this impurity into the semiconductor body, thereby forming islands or zones of p-type or n-type silicon in the areas 3 and 4. During this treatment an oxide layer may again be formed over the surface of the areas 3 and 4 which subsequently will be etched away to provide contact space for ohmic contacts.

As seen in FIGURE 1, the source zone 3 and drain zone 4 are spaced apart and the region therebetween is designated the channel. In the past, the silicon oxide layer covering this channel was employed as the insulation layer and a film of metal was deposited thereon to make the gate. Now according to this invention, the silicon oxide layer over the channel region is removed, as by etching, and a film 6 of poly(p-xylylene) is deposited over the channel. The removal of the oxide layer and the deposition of the poly(p-xylylene) film are done by masking and etching so that, in general, only the channel region of the semiconductor body is affected. A conducting electrode, for example a film of aluminum, is then deposited over the poly(p-xylylene) film to form the gate 7.

Figure 2:
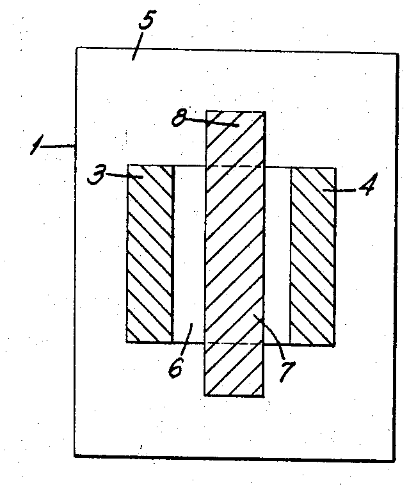
FIGURE 2 shows diagrammatically a plan view of a semiconductor body with the source, drain, insulation, and gate areas outlined.

In FIGURE 2, the source 3, drain 4, insulator 6 and gate electrode 7 only are illustrated to show the relative sizings of these areas as used in one embodiment of the invention wherein the gate electrode extends beyond the source and drain islands and beyond the area of the poly(p-xylylene) film so that a portion of the gate electrode actually rests on the silicon oxide covered base. This would allow for the easy attachment of a lead, such as 9 in FIGURE 1, in an area such as 8. Since thermal methods are generally used to attach leads, it is preferable to have the connection made in an area not underlaid with the organic poly(p-xylylene) film. Leads to the source and drain are shown at 10 and 11 respectively.

Field effect transistors which are built on n-type silicon operate in an induced channel mode as follows: the source and drain zones or islands behave as back-to-back $p^+$-n-$p^+$ diodes to an external circuit and only the saturation junction current $i_s$ will flow as long as no gate voltage is applied. A conductive channel, or inversion layer, between the source and drain is inducted by biasing the gate negative with respect to the source. The negative gate voltage will generate an electric field at the silicon surface in such a direction as to repel electrons and attract holes from the bulk of the silicon. When the density of holes in the layer between the source and the drain exceeds that of electrons at the silicon surface, the conductivity type inverts from n-type to p-type and conductance can now take place in the channel between the source and the drain because the electrical configuration is now $p^+$-p-$p^+$. The drain is made negative to the source for normal operation.

A gate threshold voltage of up to a few volts may be required to induce conductance in the channel. This threshold voltage must be added to the desired gate bias voltage.

The insulated-gate field effect transistor can also be operated in a carrier depletion mode if, during manufacture, an inversion layer on the surface of the silicon is permanently created between the source and the drain by the diffusion of doping elements into the channel region. Since the channel will then be of the same conductivity type as the source, drain current will flow at zero gate bias and the transistor may be operated in either the depletion mode or in the enhancement mode and can be used in zero bias amplifier circuitry, for example.

Other configurations and types of insulated gate field effect transistors are known. It is only necessary that the device have the two zones of semiconductive material separated by a channel with at least one gate electrode overlying all or a part of the channel and the para-xylylene polymer, and in particular the poly(p-xylylene) film of this invention insulating the gate electrode from the channel.

The gate-insulator-semiconductor structure making up the gate control is thus a capacitor. The transconductance and amplification factor of the field effect transistor are directly proportional to the dielectric constant of the insulator material and inversely proportional to the thickness of the insulation layer. While the silicon dioxide insultation generally used on silicon semiconductor bodies has a relatively high dielectric constant (4.25), problems do arise in regard to obtaining very thin films while at the same time maintaining a hole-free structure. The poly(p-xylylene) used herein has a dielectric constant of 2.65, but can be made in pin hole free films of very small thicknesses. In this way a superior gate control structure can be provided using the poly(p-xylylene) insulation of this invention.

The poly(p-xylylene) insulator film can be grown to any desired thickness from less than 100 angstroms to 10,000 angstroms (one micron) or more. For the field effect transistors described therein, the thickness of the poly(p-xylylene) film should be from about 100 angstroms to about 2,000 angstroms. A preferred range for the poly(p-xylylene) film thickness is from about 100 angstroms to 800 or 1,000 angstroms. Film thicknesses of 100 to 300 angstroms are easily attained using the poly(p-xylylene) material, whereas with SiO and $SiO_2$ thickness of less than 800 anstroms are very difficult to achieve. Field effect transistors having these very thin insulating films of poly(p-xylylene) will have high transconductance and amplification factors.

The insulating film between the gate electrode and the channel must withstand the gate bias voltage. For example, for a 10 volt gate bias and an insulating film 0.1 micron or 1,000 angstroms thick, the dielectric strength of the film must equal or exceed 10 volts/0.1 micron or 100 volts/micron ($1\times10^6$ volts/cm.). The poly(p-xylylene) film has the high dielectric strength of about $5\times10^6$ volts/cm. for thicknesses from about 100 angstroms to 10,000 angstroms. The temperature coefficient of capacitance is constant at about —200 p.p.m./°C. over a temperature range from —195° C. to +175° C. and the dielectric constant (2.65) is independent of frequency from 100 c.p.s. to about 2 mc.s. the dissipation factor is as low as 0.01% and independent of frequency from 100 c.p.s. to about 1 mc.s. and of temperature from —195° C. up to +175° C. The resistivity of the material is in excess of $10^{17}$ ohm-cm. at 25° C. and the insulation resistance ranges from $10^6$ megohm-microfarads at 25° C. to about 75 megohm-microfarads at 170° C.

Since the polymer film can be applied by vapor deposition techniques, its use is entirely compatible with the other processing steps involved in making insulated gate field effect transistors. Previous attempts to vacuum deposit very thin organic insulating or dielectric layers have involved external stimulation or polymerization by a glow discharge, ultraviolet irradiation or electron bombardment, with resulting difficulties in achieving uniform films with reproducible electrical and physical properties.

More specifically, the para-xylylene polymer films used as an insulator in the insulated gate field effect transistor are obtained and applied to the transistor body through condensation of vaporous diradicals having the structure:

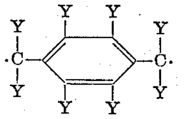

in which Y can represent any inert monovalent group, as hereinafter more fully described. These p-xylylene diradiacls are stable in the vaporous state at temperatures above 200–250° C. but will condense into a thin void-free film of a solid linear polymer, termed herein poly-xylylene polymer which can be characterized by the repeating structure:

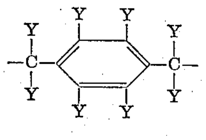

When the Y groups are all hydrogen, the polymer is termed poly(p-xylylene) and this is the preferred insulating material of this invention.

Each different diradical tends to have its separate condensation temperature generally ranging from about 25° C. to about 250° C. or slightly above depending to a degree on the ambient pressure of the system.

The above mentioned p-xylylene diradicals can be made by any of several techniques. The method found most convenient and preferred is by the pyrolysis at temperatures between about 400° C. and about 700° C. of at least one cyclic dimer represented by the structure:

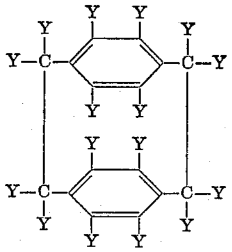

wherein Y is any monovalent inert substituent group, preferably hydrogen or halogen although on the aromatic nucleus, it can be any inert substituent group when starting with this dimer. The Y substituents on the alpha carbon atoms should be non-polar for best performance as an insulating material. On pyrolysis, the dimer cleaves into two separate reactive vaporous diradicals each having the structure:

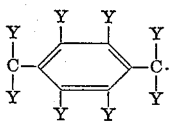

Thus, where all the Y groups are hydrogen, or where the nuclear substituent on each diradical is the same, two moles of the same p-xylylene diradical are formed, and when condensed yield a substituted or unsubstituted p-xylylene homopolymer. When the aromatic nuclear substituent Y groups on each diradical are different or where they are the same but are present on the diradical species in different amounts, two different diradicals are formed, condensation of which will yield copolymers as hereinafter set forth.

Alpha substituted p-xylylene diradicals, as for example the alpha-halogen substituted compounds, are also prepared by the pyrolysis of an aryl bis-sulfone of the structure:

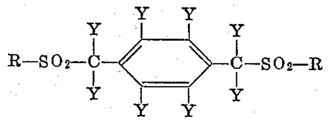

where R is a lower hydrocarbon group, and Y is defined as above. The Y substituents on the alpha carbon atoms should be non-polar as well as inert. These sulfones pyrolyze on heating to temperatures of about 600° C.–1000° C. into sulfur dioxide and the reactive diradical.

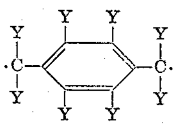

This technique is particularly desirable for introducing alpha halo substituent groups in the polymer. Outstanding among such polymers is the highly thermally stable poly($\alpha,\alpha,\alpha',\alpha'$,-tetrafluoro-p-xylylene).

Reactive diradicals are also prepared by the pyrolysis of a diaryl sulfone of the structure:

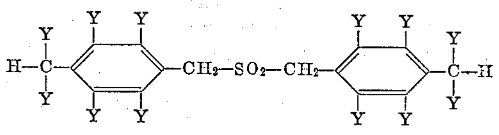

wherein Y is defined as above. The Y substituents on the alpha carbon atoms should be non-polar. These sulfones pyrolyze on heating to temperatures of about 400° C.–

800° C. into sulfur dioxide and 2 moles of monoradical of the formula:

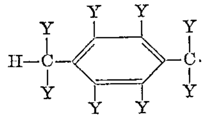

which disproportionates into a p-xylene and a diradical of structure:

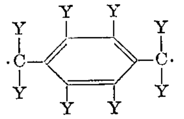

Any other technique of making the vaporous diradicals can of course be used. Since the pyrolysis of the cyclic dimer di-p-xylylene involves no other by-products and the dimer cleaves quantitatively into two moles of the reactive diradical, this method is most preferred.

Inasmuch as the coupling and polymerization of these reactive diradicals upon the condensation of the diradicals does not involve the aromatic ring, any unsubstituted or desired substituted p-xylylene polymer can be prepared since the substituent groups function essentially as an inert group. Thus, the substituent Y-group can be any organic or inorganic group which can normally be substituted on an aromatic nucleus or on the aliphatic α carbon atoms of such a diradical.

Notable among the monovalent inert groups that have been placed on the aromatic nuclei or aliphatic α carbon atoms of such para-xylylene polymers other than hydrogen are the halogens including chlorine, bromine, iodine and fluorine, alkyl groups such as methyl, ethyl, propyl, butyl and hexyl, cyano, phenyl, amine, nitro, carboxyl, benzyl and other similar groups. While some of the above groups are potentially reactive in certain conditions or with certain reactive materials, they are unreactive under the conditions of the present invention and hence are truly inert in the instant case.

It may also be evident that certain physical attributes of specific para-xylylene polymers may be so desirable that their dielectric properties, sometimes inferior to that of poly(p-xylylene), may be acceptable or tolerated. Poly(2-chloro-p-xylylene) for example, is a very tough polymer having certain mechanical benefits over other para-xylylene polymers. Also poly(α,α,α′,α′, tetra-fluoro-p-xylylene) is highly temperature resistant and can even tolerate exposure of 300° C. for 100 hours without any change in physical strength. Of the substituted para-xylylene polymers these two are preferred. Normally, however, the unsubstituted poly(p-xylylene) is preferred for use in the present invention, i.e. where all Y substituents on the polymer are hydrogen, as the polymer made from it possesses the most stable electrical properties and the most desirable dielectric constant of all these polymers.

The substituted di-p-xylylenes and the aryl sulfones from which these reactive diradicals are prepared, can be prepared by techniques commonly known to most organic chemists. For example, the cyclic dimer, di-p-xylylene, is readily susceptible to halogenation, alkylation and/or oxidation and reduction techniques and like methods of introduction of such substitutent groups into aromatic nuclei. Inasmuch as the cyclic dimer is a very stable product up to temperatures of about 400° C., elevated temperature reactions can also be employed for the preparation of various substituted materials. As used herein the term "di-p-xylylene" refers to any substituted or unsubstituted cyclic di-p-xylylene as hereinabove discussed, and the term "p-xylylene diradical" refers to any substituted or unsubstituted p-xylylene structure having a free radical or free valence electron on each alpha carbon atom as hereinabove discussed.

In the polymerization process, the vaporous diradicals condense and polymerize nearly instantaneously at the condensation temperature of the diradicals. The coupling of these diradicals involves such low activation energy and the chain propagation shows little or no preference as to the particular diradical, so that steric and electronic effects are not important as they are in vinyl polymerization, for example. The substituted and/or unsubstituted p-xylylene homopolymers can be made by cooling the vaporous diradical down to any temperature below the condensation temperature of the diradical. It has been observed that for each diradical species, there is a definite ceiling condensation temperature above which the diradical essentially will not condense and polymerize. All observed ceilings of substituted p-xylylene diradicals have been below about 200° C. but vary to some degree upon the operating pressure involved. For example, at 0.5 mm., Hg pressure, the optimum condensation and polymerization temperatures observed for the following diradicals are:

| | ° C. |
|---|---|
| p-Xylylene | 25–30 |
| Chloro-p-xylylene | 70–80 |
| n-Butyl-p-xylylene | 130–140 |
| Iodo-p-xylylene | 180–200 |
| Dichloro-p-xylylene | 200–250 |
| α,α,α′,α′, Tetrafluoro-p-xylylene | 35–40 |

Thus, by this process, homopolymer dielectric films are made by maintaining the transistor substrate surface at a temperature below the ceiling condensation temperature of the particular diradical specie involved, or desired in the homopolymer. This is most appropriately termed "homopolymerizing conditions."

Where several different diradicals existing in the pyrolyzed mixture have different vapor pressure and condensation characteristics, as for example, p-xylylene and chloro-p-xylylene and dichloro-p-xylylene or any other mixture with other substituted diradicals, homopolymerization will result when the condensation and polymerization temperature is selected to be at or below that temperature where only one of the diradicals condense and polymerize. Thus, for purposes within this application, the terms "under homopolymerization conditions" are intended to include those conditions where only homopolymers are formed. Therefore, it is possible to deposit homopolymers from a mixture containing one or more of the substituted diradicals when any other diradicals present have different condensation or vapor pressure characteristics, and wherein only one diradical specie is condensed and polymerized on the transistor substrate surface. Of course, other diradical species not condensed on the substrate surface can be drawn through the deposition apparatus in vaporous form to be condensed and polymerized in a subsequent cold trap.

Inasmuch as unsubstituted p-xylylene diradicals, for example are condensed at temperatures about 25° C. to 30° C., which is much lower than chloro p-xylylene diradicals, i.e., about 70° C. to 80° C., it is possible to have present such diradicals in the vaporous pyrolyzed mixture along with the chlorine-substituted diradicals. In such a case, homopolymerizing conditions are secured by maintaining the transistor substrate surface at a temperature below the ceiling condensation temperature of the substituted p-xylylene but above that of the p-xylylene, thus permitting the p-xylylene vapors to pass through the apparatus without condensing and polymerizing but collecting the poly-p-xylylene in a subsequent cold trap.

It is also possible to obtain substituted copolymers through the pyrolysis process hereinabove described. Copolymers of p-xylylene and substituted p-xylylene diradicals, as well as copolymers of different substituted p-xylylene diradicals wherein the substituted groups are all the same but each diradical containing a differing number of substituent groups can all be obtained through said pyrolysis process.

Copolymerization occurs simultaneously with condensation upon cooling of the vaporous mixture of reactive diradicals to a temperature below 200° C. under polymerization conditions.

Copolymers can be made by maintaining the transistor substrate surface at a temperature below the ceiling condensation temperature of the lowest boiling diradical desired in the copolymer, such as at room temperature or below. This is considered "copolymerizing conditions," since at least two of the diradicals will condense and copolymerize in a random copolymer at such temperature.

In the pyrolytic process of di-p-xylylene the reactive diradicals are prepared by pyrolyzing the substituted and/or unsubstituted di-para-xylylene at a temperature between about 400° C. and about 700° C., and preferably at a temperature between about 550° C. to about 600° C. At such temperatures, essentially quantitative yields of the reactive diradicals are secured. Pyrolysis of the starting di-p-xylylene begins at about 400° C.–550° C. but such temperatures serve only to increase time of reaction and lessen the yield of polymer secured. At temperatures above about 700° C., cleavage of the substituent group can occur, resulting in a tri-/or polyfunctional species causing cross-linking and highly branched polymers.

Pyrolysis temperature is essentially independent of the operating pressure. For most operations, pressures within the range of 0.01 micron to 10 mm. Hg are most practical for pyrolysis. Likewise if desirable, inert vaporous diluents such as nitrogen, argon, carbon dioxide, helium and the like can be employed to vary the optimum temperature of operation or to change the total effective pressure in the system.

A useful apparatus for generating a highly directional stream of vaporous p-xylylene diradicals comprises a container open at one end, surrounded by a heating means. The open end of the container communicates by means of a vapor tight seal through an orifice with an elongated cylindrical tube. The tube is surrounded for at least a portion of its length by a heating means which in turn is surrounded by a radiation heat shield. The solid dimer is heated in the container to a temperature above about 150° C. to form the dimer vapor. The vapor is heated further in the tube to a cleavage temperature of about 400 to 700° C., preferably about 600° C. The outlet end of the vapor tube has a nozzle for discharging the diradical vapors into a vacuum deposition chamber, where the suitably masked transistor substrate is supported and held at a temperature of from about −40° C. to about 50° C.

In the production of a poly(p-xylylene) insulated gate field effect transistor of this invention the following steps would be included: first a wafer 2 of silicon semiconductive material is polished and etched to a suitable thickness, say 0.008 inch thick; a surface of the wafer is then passivated, as by oxidation in a furnace at 1200° C. in an oxygen-stream, followed by a cooling in nitrogen for one hour to produce an oxide layer 5 of about 4000 angstroms thick; the source 3 and drain 4 contact areas are exposed by mask and photoetch techniques to remove the silicon dioxide coating from the source and drain areas only, the source and drain areas exposed could be 100 microns wide each and 500 microns long each, with a 12.5 micron space between them (in the drawing this space is shown greater for clarity). The source and drain contacts are then formed by first depositing and then diffusing the desired impurity into those areas, but not into the areas still covered by silicon dioxide, e.g., to achieve p-type source and drain zones, $B_2O_3$ is deposited over the exposed source and drain areas in sufficient amounts and diffused by heating at about 1000° C. for 1 hour. The silicone dioxide coating formed over the source and drain areas during diffusion may then be removed and the source and drain surfaces metallized to provide good contact for an electrical connection. The gate area is now exposed using mask and photoetch techniques to remove the silicon dioxide layer therefrom; the poly(p-xylylene) layer 6 is deposited by vacuum deposition over the gate area using a mask on the transistor substrate which is mounted in the poly(p-xylylene) generator. In FIG. 1, the gate contact area does not extend completely from the source of drain and an edge of silicon dioxide 12 is left covering the junctions between the regions of different conductivity types. In FIG. 2, however, all of the silicon dioxide between the source and drain is shown removed and then covered by poly(p-xylylene). The gate electrode 7 is then deposited over the insulation by vacuum evaporation of aluminum using a mask, the mask may be registered so as to deposit aluminum on areas outside the poly(p-xylylene) film 6 and overlapping the silicone dioxide surface in the area 8 so as to provide a place for bonding the lead wire 9 as shown in FIG. 2.

In the device shown in FIG. 1, the gate electrode 7 is shown covering less than the width of the channel between the source and drain. This would generally be satisfactory for a device operating in the depletion mode. However for a device operating in the induced channel mode, the gate electrode must actually overlap the two junctions at either side of the channel with the source and drain areas. In such a case, the poly(p-xylylene) film would extend over the whole width of the channel and overlap the source-channel and drain-channel junctions. The gate electrode film would then be deposited over the poly(p-xylylene) film covering the whole width of the channel and also overlapping the junctions, but not as far as the edge of the insulator film. An example of such a device based on the previously described device has a 12.5 micron channel width, might be as follows: the source and drain each 75 microns wide and 475 microns long, the gate 37 microns wide and 675 microns long.

The wafer may be scribed and broken into chips, if many devices were formed on it and the chips mounted in a housing and leads 9, 10, and 11 attached as by thermo-compression bonding.

In another method for making the device, the poly(p-xylylene) film may be deposited over a larger area of the device and then the film removed from the electrode contact areas. A metal mask is placed over the wafer and the contact areas for the gate, source and drain left exposed. The polymer covering these areas is then degraded by ion bombardment, glow discharge, electron bombardment, or by other means, to remove the exposed polymer.

It is to be noted that while the invention has been described with regard to only several types of insulated-gate field effect transistors, it is not meant to be so limited, and in fact the invention is applicable to all types and configurations of such devices using a control electrode overlying a semiconductor body with a poly(p-xylylene) film located therebetween. For example, this invention is meant to cover the case where the source and drain zones are not themselves formed of semiconductive material, but are merely films of conductive metals formed on opposite sides of a body of semiconductive material. A gate-insulator control structure overlies the semiconductive body to control carrier flow therein. This type construction is found in thin film field effect transistors.

What is claimed is:

1. A semiconductor device comprising a body of semiconductive material of one conductivity type and including a first source region and a second spaced-apart drain region thereon, said first and second regions being of a conductivity type opposite to that of the body of semiconductive material, a film of para-xylylene polymer disposed over at least a portion of the area between the spaced-apart first and second regions, and a gate electrode overlying at least a portion of the para-xylylene polymer film and insulated from the semiconductor body.

2. A semiconductor device comprising a body of semiconductive material including first and second spaced-apart regions therein of a conductivity type opposite to that of the semiconductor body, a film of poly(p-xylylene) disposed over at least a portion of the area between the spaced-apart first and second regions, and a gate electrode overlying at least a portion of the poly(p-xylylene) film and insulated from the semiconductor body.

3. A semiconductor device comprising a body of semiconductive material including first and second spaced-apart regions therein of a conductivity type opposite to that of the semiconductor body, a film of poly(p-xylylene) disposed over at least a portion of the area between the spaced apart first and second regions, and a gate electrode disposed over the film of poly(p-xylylene) and overlying at least a portion of the area between the source and drain regions.

4. A semiconductor device comprising a body of semiconductive material, a first region of opposite conductivity type diffused into a surface of the body, a second region diffused into the same surface but spaced apart from the first region and of the same conductivity type as the first region, a film of poly(p-xylylene) disposed over at least a portion of the surface area of the body between said first and second regions, and a conductive gate electrode overlying at least a portion of the poly(p-xylylene film and insulated from the semiconductor body.

5. A semiconductor device comprising a body of semiconductive material including first and second spaced-apart regions therein of a conductivity type opposite to that of the semiconductor body, a film of poly(p-xylylene) disposed over the area of the semiconductor body between the first and second regions and overlapping the edge portions of those regions, and a gate electrode disposed over the film of poly(p-xylylene) and extending from an overlapped portion of the first region to an overlapped portion of the second region.

6. A semiconductor device comprising a body of semiconductive material of one conductivity type, said body having at least one plane surface, a first region of another conductivity type diffused into a portion of a plane surface of the body, a second region of the same conductivity as the first region diffused into another portion of the same surface, but spaced apart from the first region, an adherent film of poly(p-xylylene) disposed over at least the surface area of said body located between the first and second regions, and an adherent metallic film disposed over at least a portion of the poly(p-xylylene) film and insulated from the semiconductor body.

7. A semiconductor device according to claim 6 wherein a channel portion of the semiconductive body extending from the first region to the second region is of a conductivity type different than that of the semiconductor body.

8. A semiconductive device according to claim 7 wherein the channel portion is of the same conductivity type as the first and second regions.

9. A semiconductor device comprising a body of semiconductive material of one conductivity type, said body having at least one plane surface, a first region of another conductivity type diffused into a portion of a plane surface of the body, a second region of the same conductivity as the first region diffused into another portion of the same surface, but spaced apart from the first region, an adherent oxide insulating film disposed over at least some portions of the semiconductor body other than a portion of the surface area of said body between the first and second regions, an adherent film of poly(p-xylylene) disposed over at least a portion of the surface area of said body between the first and second regions, and an adherent metallic film comprising a gate electrode is disposed over at least a portion of the poly(p-xylylene) film and insulated from the semiconductor body.

10. A semiconductor device according to claim 9 wherein the oxide insulating film extends over all areas of the surface of said body except at least a portion of the area between the first and second regions, and wherein separate electrical connectors extend past the oxide layer in the first and second regions to make electrical contact therewith.

11. A semiconductor device according to claim 10 wherein said metallic film extends over an edge of the film of poly(p-xylylene) to overlap the oxide insulating film and an electrical connection is made to the metallic film in this area of overlap.

12. A semiconductor device according to claim 9 wherein the film of poly(p-xylylene) underlying the gate electrode is from 100 to 2000 angstroms thick.

13. A semiconductor device according to claim 9 wherein the film of poly(p-xylylene) underlying the gate electrode is from 100 to 800 angstroms thick.

14. A method for making a semiconductor device comprising the steps of providing a body of semiconductive material, diffusing into a first surface portion of said body an impurity forming within said body a first region of opposite conductivity type, diffusing an impurity into a second surface portion of the body, spaced apart from the first portion, to form a second region of the same conductivity as the first, forming over at least a portion of the surface area of the body between the first and second regions an adherent film of poly(p-xylylene) by condensing thereon p-xylylene diradicals, and depositing a metallic film over at least a portion of the poly(p-xylylene) film.

15. A method for making a semiconductor device comprising the steps of forming an oxide coating on the surface of a body of semiconductive material, removing said oxide coating from two spaced apart areas of said semiconductive body to expose said areas, diffusing an impurity into each of said exposed areas of the body to form a first and a second region of conductivity type opposite to that of the semiconductive body, removing at least a portion of the oxide coating from the area of said body between said first and second regions, forming a film of poly(p-xylylene) over at least the exposed area between the first and second regions by condensing thereon p-xylylene diradicals produced by first heating a p-xylylene dimer to form vaporous dimer and then heating the vapor to a cleavage temperature in the range between about 400° and 700° C. to form the diradicals, and depositing a metallic film by evaporation over at least a portion of the poly(p-xylylene) film.

References Cited

UNITED STATES PATENTS 3,283,221 11/1966 Heiman ---------- 317—235

JOHN W. HUCKERT, *Primary Examiner*.

R. F. SANDLER, *Assistan Examiner.*